United States Patent
Chen

(12) United States Patent (10) Patent No.: US 6,200,890 B1
(45) Date of Patent: Mar. 13, 2001

(54) METHOD OF FABRICATING COPPER DAMASCENE

(75) Inventor: Terry Chung-Yi Chen, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/372,433

(22) Filed: Aug. 10, 1999

(51) Int. Cl.$^7$ .............................................. H01L 21/4763
(52) U.S. Cl. ........................ 438/618; 438/629; 438/631
(58) Field of Search ........................... 438/672, 618, 438/629, 631, 640, 666, 668, 673

(56) References Cited

U.S. PATENT DOCUMENTS 6,054,378 * 4/2000 Skala et al. .
6,066,559 * 6/2000 Gonzalez et al. .

OTHER PUBLICATIONS

Microstructure and Electromigration in Copper Damascene Lines, IEEE Mar. 1999.
Surface Electromigration in Copper Interconnects, Dept. of Electrical and Electronic Engineering, Queen's University, Belfast, U.K., IEEE Mar. 1999.
Leakage Current Degradation and Carrier Conduction Mechanisms For Cu/BCB Damascene Process Under Bias–Temperature Stress, IEEE Mar. 1999.

* cited by examiner

*Primary Examiner*—Charles Bowers
*Assistant Examiner*—Scott J. Hawranek
(74) *Attorney, Agent, or Firm*—Thomas, Kayden, Horstemeyer & Risley

(57) ABSTRACT

A fabrication method for a copper (Cu) damascene, involving etching a part of a dielectric layer after formation of the Cu conducting wires, so that the Cu conducting wires project out from the surface of the dielectric layer. A top barrier layer is formed to prevent Cu electromigration (EM) and current leakage.

11 Claims, 2 Drawing Sheets

METHOD OF FABRICATING COPPER DAMASCENE

BACKGROUND OF THE INVENTION

1. Field of Invention

The present invention relates to a method of fabricating multi-level metal interconnects for a semiconductor device. More particularly, the present invention relates to a method of fabricating a copper (Cu) damascene.

1. Description of Related Art

As the integration of the integrated circuit (IC) increases, the surface of the chip is unable to provide adequate area for fabricating the required interconnect. In order to satisfy the increased requirement for the interconnect after reducing the metal oxide semiconductor (MOS) transistor, metallization has gradually become the method employed for many IC devices. Each electrode of the MOS transistor and the metal layers are isolated from each other by a dielectric layer and connected by contact plugs, while the metal layers are also isolated from each other by the dielectric layers and connected by via plugs. However, a barrier layer is usually formed as a conducting material before plug formation to increase the adhesion between the contact plug and the electrode (or metal layer), while preventing a spike effect between the metal plugs and the silicon interface.

During a back end process of the semiconductor device, the current density of metal lines has gradually increased with the reduction of the width of metal lines. As a result, the conventional metal lines, made principally of aluminum (Al) may be influenced by electron migration (EM), which further reduces the reliability of the device.

To solve the problems where the semiconductor device mentioned above has entered the sub-quarter micron process, the use of copper (Cu) with a minimum EM has become the uniform choice for all semiconductor manufactures.

However, as Cu is not easily etched by using common etching gases, the manufacture of Cu conducting wires can no longer be achieved by conventional methods. A method of fabricating a Cu damascene is thus proposed as a solution for the above problem.

As the integration of the IC keeps increasing, it becomes increasingly difficult to manufacture a metal interconnect with better yield and reliability. The method for fabricating a double metal damascene is a method which first etches out a dielectric opening for the metal interconnect in the dielectric layer, and then fills the opening with metal as an interconnect. Such method can satisfy the need for high yield and reliability during the process, and thus it has become the best choice for manufacturing the sub-quarter micron interconnect.

FIG. 1 is a schematic diagram illustrating the manufacture of a Cu damascene in the prior art.

Referring to FIG. 1, a dielectric layer 10 is formed, wherein the dielectric layer 10 is formed on a substrate (not shown). This dielectric layer 10 may be an inter-layer dielectric or an inter-metal dielectric layer (IMD layer). A plurality of openings 12 are formed in the dielectric layer 10 by photolithographic etching, while a barrier layer (not shown) is formed to conformally cover the openings 12 and the dielectric layer 10. A Cu layer (not shown) is then formed to cover the barrier layer and to fill the openings 12. A barrier layer 14 and Cu layer which cover the surface of the dielectric layer 10 are removed by chemical mechanical polishing (CMP), so that a plurality of Cu conducting wires 16 and the barrier layer 14 are formed to complete the manufacture of the Cu damascene structure. Consequently, the Cu damascene structure is covered by a dielectric layer 18, which forms the resultant structure shown in FIG. 1.

However, it has recently been discovered that a Cu EM may readily occurs between the Cu conducting wires 16 and the dielectric layer 18. In addition, as both the barrier layer 14 and the Cu layer that cover the surface of the dielectric layer 10 are removed by CMP, the portion of the sidewall adjacent to the top of the barrier layer 14 may produce pinholes (not shown) due to the stress. This may lead to current leakage on the sidewall of the barrier layer 14 (shown as dash lines along the interface 19 in FIG. 1), thus reducing the reliability of the device.

SUMMARY OF THE INVENTION

The invention provides a method for fabricating a Cu damascene, which prevents not only electron migration (EM), but also occurrence of the current leakage on the sidewall of the barrier layer, whereby the reliability of the device is improved.

The invention provides a fabricating method for a Cu damascene; the method includes forming a dielectric layer, in which a plurality of openings are formed. A barrier layer is formed conformal to the profile of the openings so as to form a plurality of Cu conducting wires in the openings. A part of the dielectric layer is removed by etching until the Cu conducting wires project out the surface of the dielectric layer to expose a part of the sidewall of the barrier layer. A top barrier layer is formed to conformally cover the surface of the dielectric layer, the sidewall of the barrier layer, and the surface of the Cu conducting wires. Next, an oxide layer is formed on the top barrier layer by plasma enhanced chemical vapor deposition (PECVD). This PECVD oxide layer has poorer step coverage on the dielectric layer 20 between two Cu lines. An etching back is performed to remove a part of the oxide layer so as to expose a part of the top barrier layer located between the Cu conducting wires. With the remaining oxide layer serving as an etching mask and the dielectric layer as an etching stop layer, the exposed part of the top barrier layer is removed to expose the surface of the dielectric layer.

According to the invention, a part of the dielectric layer is removed to allow the projection of the Cu conducting wires from the surface of the dielectric layer while exposing a part of the sidewall of the barrier layer. A top barrier layer is formed to contain Cu in the Cu conducting wire so as to prevent the Cu EM, while the top barrier layer can also compensate the initial barrier layer that was damaged. Thus, the leakage current between two Cu conducting wires is prevented.

The purpose of the invention is to prevent the Cu EM and the current leakage from the sidewall of the barrier layer, so that the device can maintain better reliability.

According to the invention, an oxide layer with a uniform thickness is deposited by PECVD. An etching back is performed to remove a part of the oxide layer until a part of the top barrier layer located between the Cu conducting wires is exposed. With the remaining oxide layer serving as an etching mask and the dielectric layer as an etching stop layer, the exposed part of the top barrier layer is removed to expose the surface of the dielectric layer. An additional and precise mask is not required in this case, while the process window may also be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2F are schematic diagrams illustrating the process flow for fabricating a copper (Cu) damascene according to one preferred embodiment of this invention.

Figure 1:
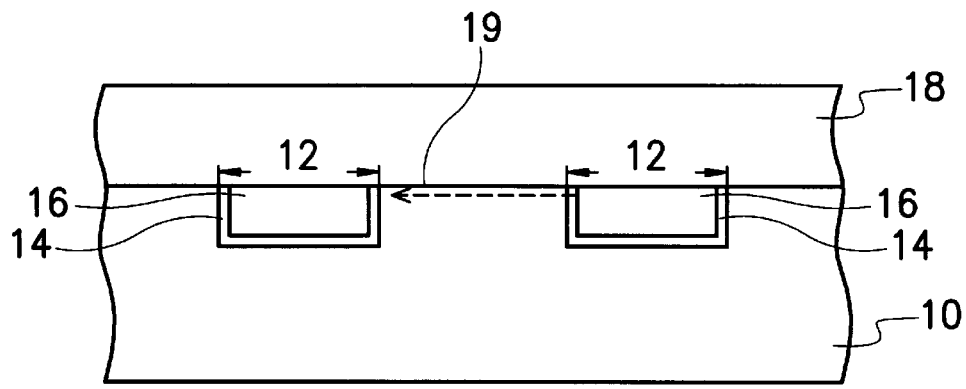
FIG. 1 is a schematic diagram illustrating the manufacture of a copper (Cu) damascene in the prior art.
Figure 2A:
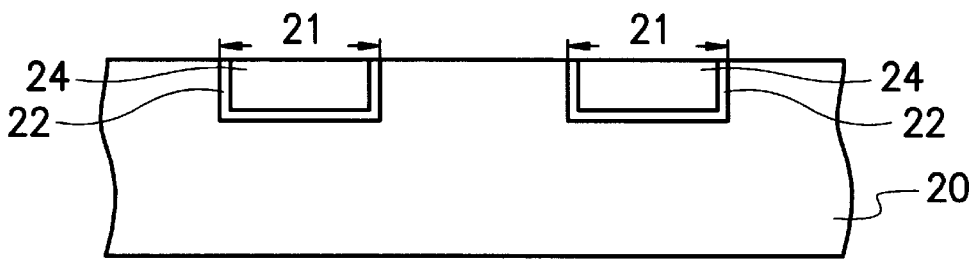
FIGS. 2A to 2F are schematic diagrams illustrating the process flow for fabricating a Cu damascene according to one preferred embodiment of this invention.

Referring to FIG. 2A, a dielectric layer 20 is formed, wherein the dielectric layer 20 is formed on a substrate (not shown). A plurality of openings 21 are formed in the dielectric layer by photolithographic etching, wherein each of the openings 21 further includes a contact opening and a via opening. A barrier layer 22 is formed to conformally cover the profile of the openings 21. The material for the barrier layer 22 may include titanium nitride (TiN), tungsten nitride (WN), or tantalum nitride (TaN), while the method may involve sputtering. A Cu layer (not shown) is formed to cover the barrier layer 22, followed by CMP removal of the barrier layer 22 and the Cu layer which covers the surface of the dielectric layer 20. This forms a plurality of Cu conducting wires 24 having barrier layers 22.

The dielectric layer 20 may be a dielectric layer simply having a low dielectric constant (k); it may also be an inter-metal dielectric (IMD) layer or an inter-layer dielectric layer with a multi-level structure.

Figure 2B:
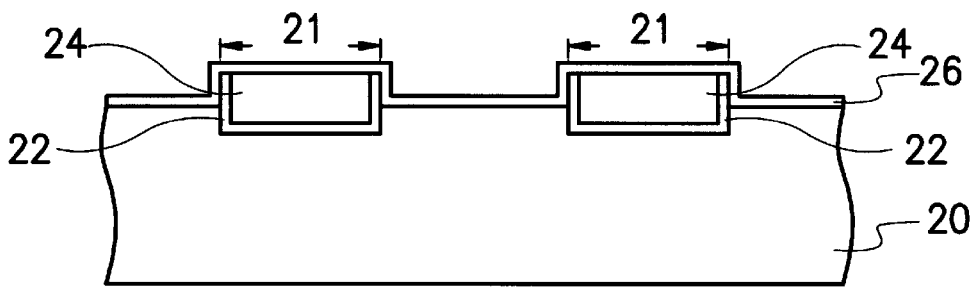

Referring to FIG. 2B, a part of the dielectric layer 20 is etched until the Cu conducting wires 24 project out from the surface of the dielectric layer 20 while exposing a part of the sidewall of the barrier layer 22. A top barrier layer 26 having a suitable and uniform thickness is formed to conformally cover the surface of the dielectric layer 20, the sidewall of the barrier layer 22, and the surface of the Cu conducting wires 24. As shown in FIG. 2B, the material for the top barrier layer 26 may include tantalum with a thickness of less than approximately 500 Å.

Figure 2C:
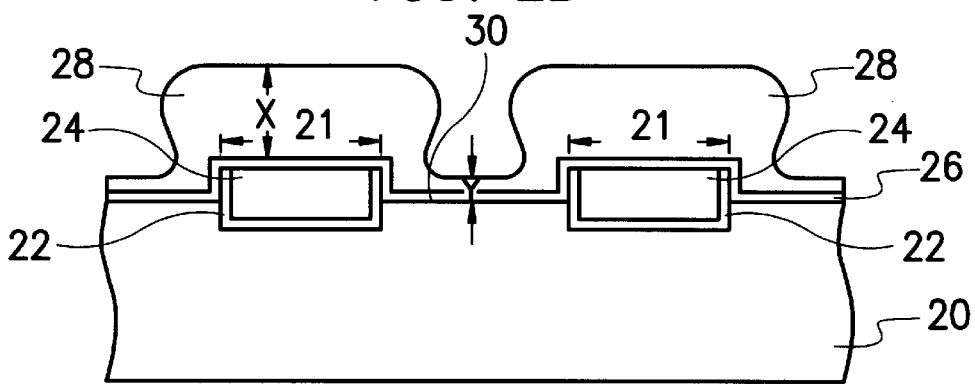

Referring to FIG. 2C, an oxide layer is formed by PECVD on the top barrier layer 26. Since PECVD offers poor step coverage, an overhang may occur as a result of different deposition rates due to different aspect ratios during the deposition of the oxide layer 28, when there are demands for an increased device integration and a minimum line width. As shown in FIG. 2C, the oxide layer 28 with a thickness "y" above the interface 30 between the Cu conducting wires 24 is therefore thinner than the oxide layer 28 with a thickness "x" above the Cu conducting wires 24.

Figure 2D:
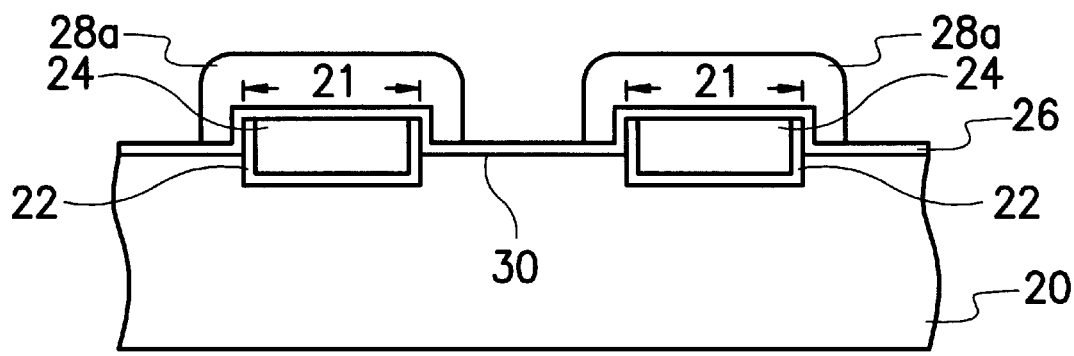

The oxide layer 28 has a different etching selectivity ratio from the top barrier layer 26, so a part of the top barrier layer 26 above the interface 30 between the Cu conducting wires 24 is exposed to form the oxide layer 28a as shown in FIG. 2D.

Figure 2E:
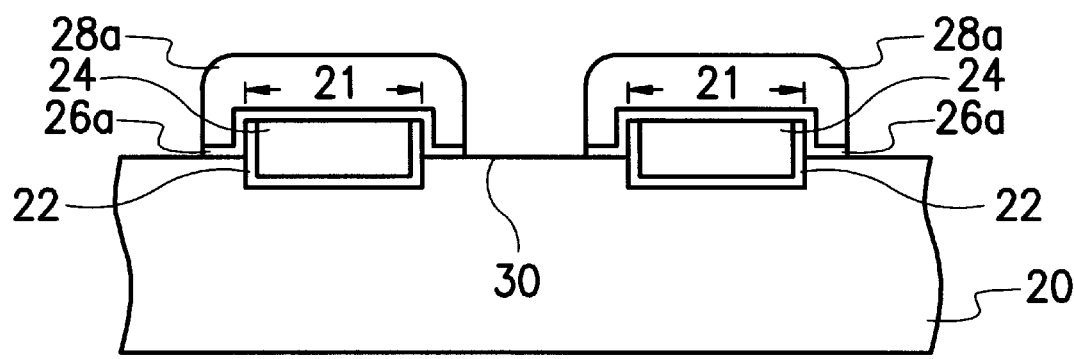

With the oxide layer 28a serving as an etching mask and the dielectric layer 20 as an etching stop layer, an exposed part of the top barrier layer 26 between the Cu conducting wires 24 is removed by etching to form the top barrier layer 26a as shown in FIG. 2E.

While some regions in the chip have a higher concentration of devices, devices in other regions are more scattered. In the regions concentrated with devices, an oxide layer 28 without uniform thickness is formed by PECVD, which offers a poor step coverage and formation of an overhang. An etching back process is performed to remove a part of the oxide layer 28. With the remaining oxide layer 28a serving as an etching mask, the top barrier layer 26 is etched. As a consequence, no additional and precise mask is required in the region concentrated with devices, while the process window is also increased. In contrast, the oxide layer 28 deposited in the region with scattered devices has a more uniform thickness without formation of an overhang due to a large space gap between the Cu conducting wires 24. Therefore, a non-critical reverse mask could be employed to perform an etching back for the oxide layer 28 in regions with the scattered devices. However, the region concentrated with the devices is used as an example in the present embodiment.

Figure 2F:
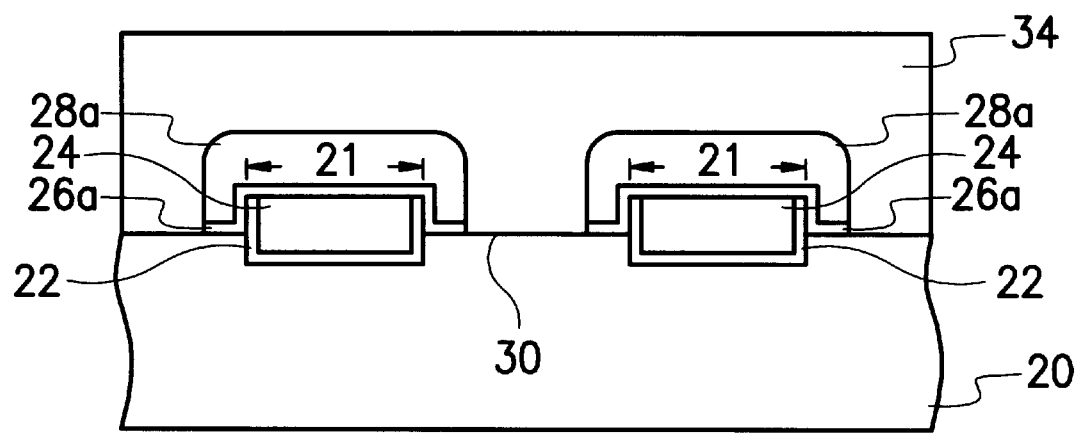

Referring to FIG. 2F, a dielectric layer 34 is formed to cover the surface of the oxide layer 28a and the dielectric layer 20.

Meanwhile, the invention is also applicable to the Cu dual damascene process, in which the process flow and the materials involved are the same as the described in FIG. 2A through to FIG. 2F, therefore they are not described again.

Summarizing the above, it is understood that the purpose of the invention is to etch a part of the dielectric layer so that the Cu conducting wires project out of the surface of the dielectric layer while exposing a part of the sidewall of the barrier layer. A top barrier layer is formed to prevent the Cu EM that would otherwise occur when Cu from the Cu conducting wire migrated via the top barrier layer to another Cu conducting wire. In addition, the sidewall adjacent to the top of the barrier layer is covered by the top barrier layer. Therefore, the invention prevents the current leakage from the sidewall of the barrier layer, so that the device can maintain a better reliability.

According to the invention, an oxide layer with a non-uniform thickness is deposited by PECVD. An etching back is performed to remove a part of the oxide layer until a part of the top barrier layer located between the Cu conducting wires is exposed. With the remaining oxide layer serving as an etching mask and the dielectric layer as an etching stop layer, the exposed part of the top barrier layer is removed to expose the surface of the dielectric layer. An additional and precise mask is not required in this case, while the process window may also be increased.

It will be apparent to the skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a copper (Cu) damascene, comprising steps of:

forming a plurality of openings in a dielectric layer;

forming a conformal barrier layer in these openings;

forming a plurality of Cu conducting wires in these openings;

removing a part of the first dielectric layer to expose a part of a sidewall of the barrier layer, so that the Cu conducting wires project out from the surface of the first dielectric layer;

forming a top barrier layer, wherein the top barrier layer conformally covers the Cu conducting wires and the sidewall of the barrier layer;

forming an oxide layer to cover the top barrier layer;

removing a part of the oxide layer to expose a part of the top barrier layer between the Cu conducting wires;

removing the exposed top barrier layer with the remaining oxide layer as an etching mask until the surface of the first dielectric layer is exposed; and forming a second dielectric layer, wherein the second dielectric layer completely covers the remaining oxide layer and the first dielectric layer.

2. The method of claim 1, wherein the first dielectric layer includes an inter-metal dielectric (IMD) layer.

3. The method of claim 1, wherein the first dielectric layer includes an inter-layer dielectric layer.

4. The method of claim 1, wherein the top barrier layer includes tantalum (Ta).

5. The method of claim 1, wherein the opening includes a contact opening.

6. The method of claim 1, wherein the opening includes a via opening.

7. The method of claim 1, wherein the method for forming the oxide layer includes plasma enhanced chemical vapor deposition (PECVD).

8. The method of claim 1, wherein the oxide layer between the Cu conducting wires is thinner.

9. The method of claim 1, wherein the method for removing a part of the oxide layer includes etching.

10. A method of fabricating a Cu damascene, comprising steps of:

forming a plurality of openings in a first dielectric layer;

forming a barrier layer to conformally cover the openings and the first dielectric layer;

forming a Cu layer to fill the openings and to cover the barrier layer;

removing a part of the barrier layer and the Cu layer on a surface of the first barrier layer to form a plurality of Cu conducting wires;

removing a part of the first dielectric layer to expose a part of a sidewall of the barrier layer, so that the Cu conducting wires project out from the surface of the barrier layer;

forming a Ta barrier layer to cover conformally the Cu conducting wires and the sidewall of the barrier layer;

forming an oxide layer by PECVD to cover the Ta barrier layer, in which the oxide layer between the Cu conducting wires is thinner;

etching a part of the oxide layer to expose a part of the Ta barrier layer between the Cu conducting wires;

etching the exposed Ta barrier layer, with the remaining oxide layer serving as an etching mask, until the surface of the first dielectric layer is exposed; and forming a second dielectric layer to completely cover the remaining oxide layer and the first dielectric layer.

11. The method of claim 10, wherein the method for removing the barrier layer and the Cu layer on the surface of the first dielectric layer includes chemical mechanical polishing (CMP).

* * * * *